(12) United States Patent
Kuo et al.

(10) Patent No.: US 8,598,030 B2
(45) Date of Patent: Dec. 3, 2013

(54) PROCESS FOR MAKING CONDUCTIVE POST WITH FOOTING PROFILE

(75) Inventors: Chen-Cheng Kuo, Chu-Pei (TW); Chen-Shien Chen, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 561 days.

(21) Appl. No.: 12/855,360

(22) Filed: Aug. 12, 2010

(65) Prior Publication Data
US 2012/0040524 A1 Feb. 16, 2012

(51) Int. Cl.
*H01L 21/44* (2006.01)
(52) U.S. Cl.
USPC .................. 438/614; 257/E21.585
(58) Field of Classification Search
USPC .................. 257/E21.585; 438/614
See application file for complete search history.

(56) References Cited

U.S. PATENT DOCUMENTS

| | | | |
|---|---|---|---|
| 6,586,322 B1 * | 7/2003 | Chiu et al. | 438/612 |
| 6,962,771 B1 | 11/2005 | Liu et al. | |
| 2011/0317385 A1 * | 12/2011 | Zhou et al. | 361/771 |

* cited by examiner

*Primary Examiner* — Marvin Payen
(74) *Attorney, Agent, or Firm* — Lowe Hauptman & Ham, LLP

(57) ABSTRACT

A process for making a copper post with footing profile employs dual photoresist films of different photosensitivities and thicknesses on an under-bump-metallurgy (UBM) layer. After an exposure lithography process, a first opening with a substantially vertical sidewall is formed in a first photoresist film, and a second opening with a sloped sidewall is formed in a second photoresist film. The second opening has a top diameter and a bottom diameter greater than the top diameter, and the bottom diameter is greater than the diameter of the first opening. A conductive layer is then formed in the first opening and the second opening followed by removing the dual photoresist films.

19 Claims, 7 Drawing Sheets

PROCESS FOR MAKING CONDUCTIVE POST WITH FOOTING PROFILE

TECHNICAL FIELD

This disclosure relates to integrated circuit fabrication, and more particularly, to processes of forming bump structures in integrated circuit devices.

BACKGROUND

Modern integrated circuits are made up of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an input/output (I/O) pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper pillar bump technology has been proposed. Instead of using a solder bump, a given electronic component is connected to a substrate by means of a copper post, which achieves finer pitch with minimum probability of bump bridging, reduces the capacitance load for the circuits, and allows the electronic component to perform at higher frequencies.

Thermal stress problems that have been observed in testing and in use after assembly in completed flip chip packages using the copper posts include delamination of extreme low-k (ELK) dielectric layers, cracks in the underfill material, the passivation layer, and pre-solder materials due to the above materials being near to the copper posts and subject to substantial thermal stress during thermal cycles. As the size of the integrated circuit devices continues to shrink, the pitch between the terminals and the corresponding copper posts will also continue to decrease. The problems associated with the thermal stresses observed using the copper posts may be expected to increase with continued reduction in the pitch between terminals. In conventional approaches to integrated circuit flip chip package assembly with a conventional copper post, a single photoresist film (a dry film or a wet film) with photolithography process is employed to define a window on the UBM layer, and then a copper layer is plated therein to form a copper post with a vertical or negative sidewall profile. However, it is difficult to enlarge the bottom dimension of the copper post. The stress in the extreme low-k dielectric layers cannot be shared by an interface between the UBM layer and the passivation layer. A need thus exists for improved integrated circuit flip chip connections, such as copper posts to solve the problems caused by thermal stress.

DETAILED DESCRIPTION OF ILLUSTRATIVE EMBODIMENTS

Figure 1A:
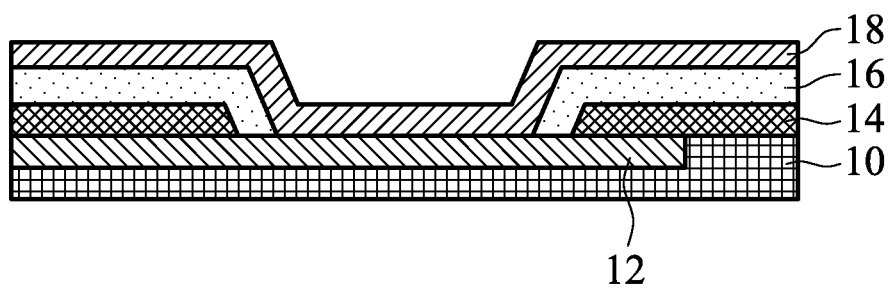
FIGS. 1A~1G are cross-sectional views of a portion of a device at various stages in an integrated circuit manufacturing process that uses negative photo resist in accordance with an exemplary embodiment of forming a copper post.

This disclosure provides methods of forming Cu posts with footing profiles applied to flip-chip assembly, wafer-level chip scale package (WLCSP), three-dimensional integrated circuit (3D-IC) stack, and/or any advanced package technology fields. References will now be made to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A~1G are cross-sectional views of a portion of a device at various stages in an integrated circuit manufacturing process in accordance with an exemplary embodiment of forming a copper post.

With reference to FIG. 1A, a semiconductor substrate 10 used for bump fabrication is employed in an integrated circuit device fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors, etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The semiconductor substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may include copper or copper alloys. One skilled in the art will realize the formation details of the metallization structure.

A conductive region 12 is a metallization layer formed on a top-level inter-layer dielectric layer, which is a portion of conductive routes and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials. In some embodiments, the conductive region 12 is a pad region, which may be used in the bonding process to connect the integrated circuits in the respective chip to external features. In some embodiments, the conductive region 12 is a redistribution layer, also referred to as a post-passivation interconnect (PPI) line.

A passivation layer 14 is formed on the substrate 10. The passivation layer 14 is patterned to form an opening exposing a portion of the conductive region 12 for allowing subsequent bump formation. In some embodiments, the passivation layer 14 is formed of a non-organic material selected from un-doped silicate glass (USG), silicon nitride, silicon oxynitride, silicon oxide, and combinations thereof. In some embodiments, the passivation layer 14 is formed of a polymer layer, such as an epoxy, polyimide, benzocyclobutene (BCB), polybenzoxazole (PBO), and the like, although other relatively soft, often organic, dielectric materials can also be used.

A polymer layer 16 is formed on the passivation layer 14. The polymer layer 16 is patterned to form an opening exposing a portion of the conductive region 12 for allowing subsequent bump formation. The opening in the polymer layer 16 may be smaller than, equal to, or greater than the opening of the passivation layer 14. In some embodiments, the polymer layer 16 is formed of a polymer, such as an epoxy, polyimide, benzocyclobutene (BCB), polybenzoxazole (PBO), and the like, although other relatively soft, often organic, dielectric materials can also be used. In some embodiments, the polymer layer 16 is a polyimide layer. In some embodiments, the polymer layer 16 is a polybenzoxazole (PBO) layer.

FIG. 1A also shows the formation of an under-bump-metallurgy (UBM) layer 18 over the semiconductor substrate 10. The UBM layer 18 is formed on the exposed portion of the conductive region 12, and extends over the polymer layer 16. In some embodiments, the UBM layer 16 includes a first layer serving as a diffusion barrier layer or a glue layer, which is formed of titanium, tantalum, titanium nitride, tantalum nitride, or the like by physical vapor deposition (PVD) or sputtering. The first layer is deposited to a thickness of between about 500 and 2000 angstrom. In some embodiments, the UBM layer 16 includes a second layer serving as a seed layer, which is formed of copper or copper alloys by physical vapor deposition (PVD) or sputtering. The second layer is deposited to a thickness of between about 500 and 10000 Angstrom.

Figure 1B:
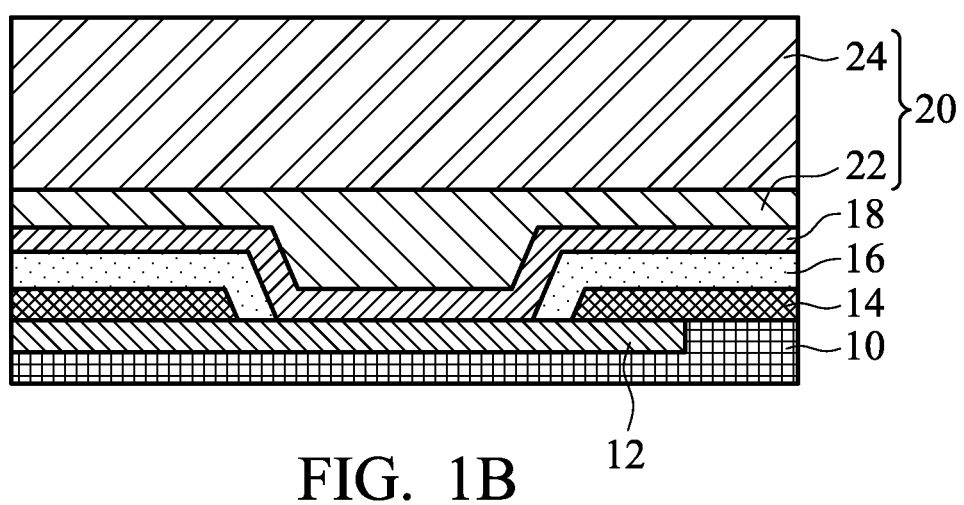

With reference to FIG. 1B, there is shown the formation of a photoresist structure 20 on the UBM layer 18. The photoresist structure 20 is a stack including at least two photoresist films of different photosensitivities. Each of the photoresist films may be a positive photoresist film or a negative photoresist film depending on the nature of the chemical changes upon exposure. If the photoresist film becomes chemically more stable upon exposure, the photoresist is a negative photoresist film. If a negative photoresist is employed, the unexposed portions of the negative photoresist are removed upon development. If the photoresist becomes chemically less stable upon exposure, the photoresist is a positive photoresist. If a positive photoresist is employed, the exposed portions of the positive photoresist are removed upon development. In one embodiment, the photoresist structure 20 includes a first photoresist film 22, and a second photoresist film 24 on first photoresist film 22. The first photoresist film 22 is a negative photoresist, having a first photosensitivity and a first thickness. The second photoresist film 24 is a negative photoresist, having a second photosensitivity and a second thickness. The second photosensitivity is greater than the first photosensitivity, and the first thickness is less than the second thickness. For example, the first photoresist film 22 has a thickness of about from 3 µm to 15 µm, and the second photoresist film 24 has a thickness of about from 40 µm to 85 µm.

Figure 1C:
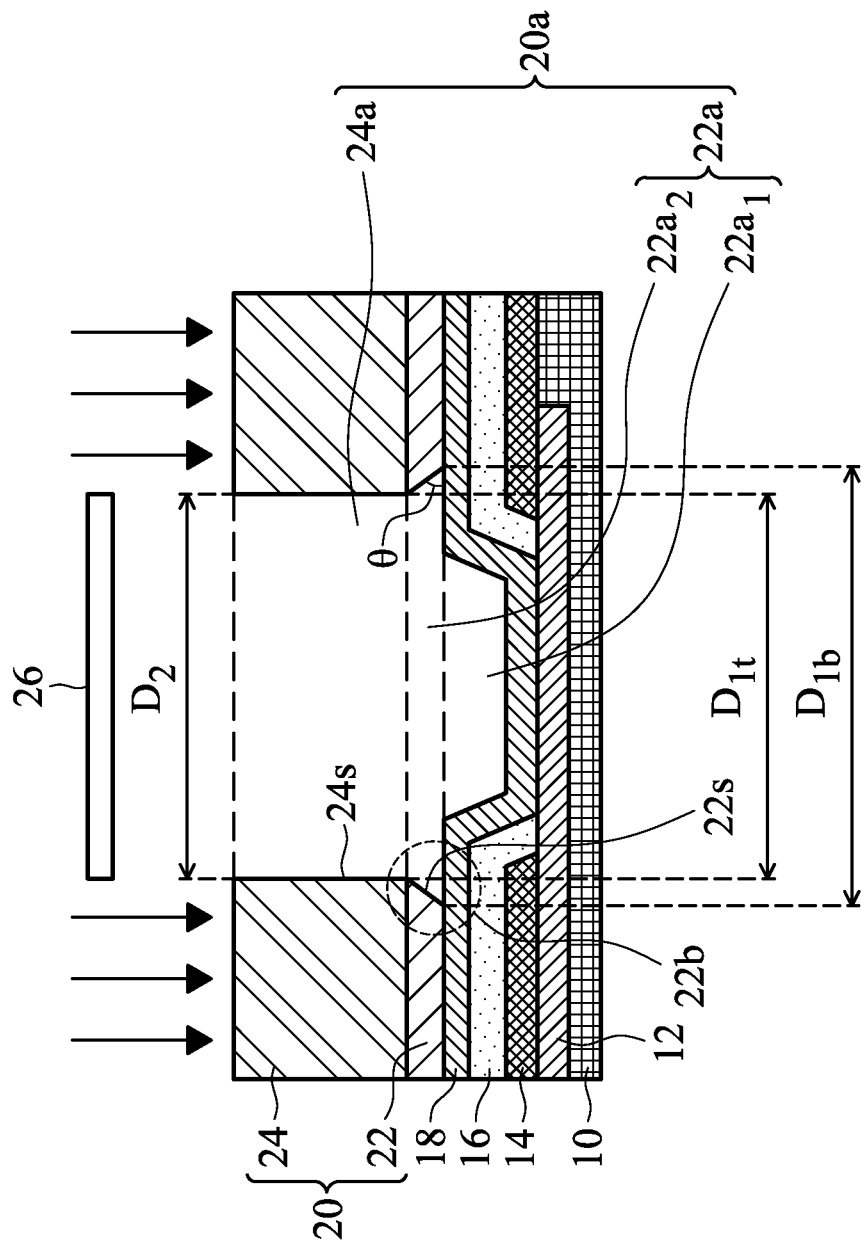

Next, as shown in FIG. 1C, a single-exposure process is employed to pattern features in the photoresist structure 20, which may be exposed to incident light, which may be deep-ultraviolet (DUV) radiation, mid-ultraviolet (MUV) radiation, or X-ray radiation. Alternately, the photoresist structure 20 may be exposed to energetic electron in e-beam lithography. Using a mask layer 26, the energy of the photons or electrons causes changes in chemical composition of exposed portions of the photoresist structure 20, for example, by cross-linkage, scission, side chain removal, etc. Pre-baking or post-baking of the photoresist may be employed to maximize the changes in the chemical properties of the exposed portion of the photoresist relative to unexposed portions of the photoresist. Since the photoresist films 22 and 24 are formed of negative photoresist, the unexposed portion of the photoresist structure 20 is developed and removed upon development to expose a portion of the UBM layer 18.

This creates an opening 20a in the photoresist structure 20, which includes a first opening 22a formed by removing the unexposed portion of the first photoresist film 22, and a second opening 24a with a substantially vertical sidewall 24s formed by removing the unexposed portion of the second photoresist film 24. The first opening 22a further includes a lower portion $22a_1$ surrounding by the exposed portion of the UBM layer 18, and an upper portion $22a_2$ surrounding by the remaining portion of the first photoresist film 22. In detail, within the upper portion $22a_2$, the bottom diameter $D_{1b}$ is greater than the top diameter $D_{1t}$, and the sidewall surface 22s of the remaining portion of the first photoresist film 22 slopes and intersects the UBM layer 18 at an angle θ less than 90 degrees. Thus, a "bird's beak" opening 22b is formed at the interface between the first photoresist film 22 and the UBM layer 18. Also, the bottom diameter $D_{1b}$ of the upper portion $22a_2$ of the first opening 22a is wider than the diameter $D_2$ of the second opening 24a. In some embodiments, the difference between the diameter $D_{1b}$ and the diameter $D_2$ is more than about 3 µm. When the openings are then filled with conductive materials in subsequent processes, a conductive post with a footing profile will be obtained.

Figure 1D:
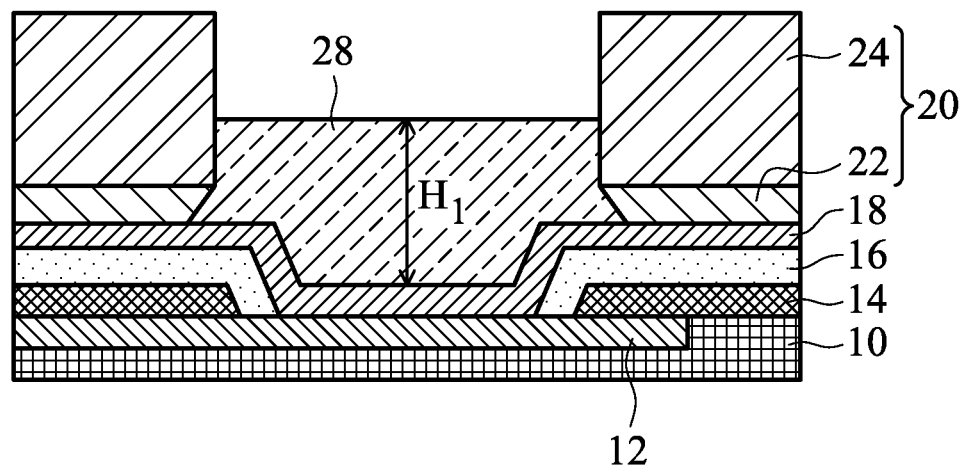

With reference to FIG. 1D, there is shown the formation of a conductive material with solder wettability in the openings 22a and 24a. In some embodiments, a copper (Cu) layer 28 is formed to fill the first opening 22a to contact the underlying UBM layer 18. The deposition of copper layer 28 may continuously fill the second opening 24a to reach a predetermined height. As used throughout this disclosure, the term "copper (Cu) layer" is intended to include substantially a layer including pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods may include sputtering, printing, electro plating, electroless plating, or chemical vapor deposition (CVD) methods. For example, electro-chemical plating (ECP) is carried out to form the Cu layer 28. In some embodiments, the ECP process using a low initial deposition rate is performed to cause a "gap filling" effect, which enables the plated copper layer to fill the bird's beak opening 22b, resulting in a footing profile in the copper layer 28 in proximity to the UBM layer 18. In an exemplary embodiment, the Cu layer 28 has a height $H_1$ measured from the lowest surface to the highest surface, which is greater than 25 μm. In some embodiments, the height $H_1$ is greater than 40 μm. For example, the height $H_1$ is about 40-50 μm thick, or about 40-70 μm, although the height may be greater or smaller. In some embodiments, the second opening 24a is partially filled with the Cu layer 28, thus a top surface of the Cu layer 28 is lower than the top surface of the second photoresist film 24. In other embodiments, the Cu deposition process may be controlled to fill the opening 24a, making the top surface level with or higher than the top surface of the second photoresist film 24 which are not shown in the figures.

Figure 1E:
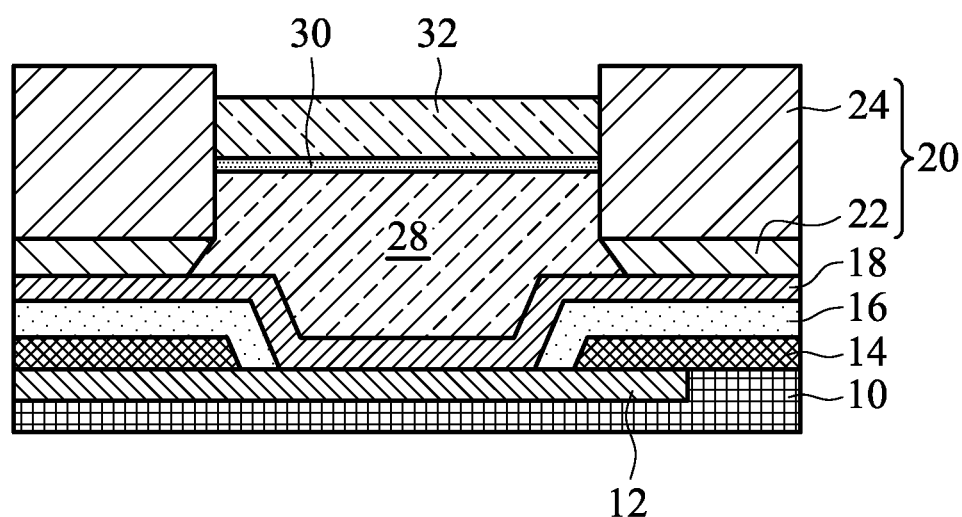

Next, as shown in FIG. 1E, a cap layer 30 and a solder layer 32 are successively formed on the top surface 20 of the Cu layer 28 in the second opening 24a. In some embodiments, the cap layer 30 acts as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 30 may include at least one of nickel (Ni), tin, tin-lead (SnPb), gold (Au), silver, palladium (Pd), indium (In), nickel-palladium-gold (NiPdAu), nickel-gold (NiAu), other similar materials, or alloys deposited by plating methods. The cap layer 30 has a thickness about from 1 μm to 10 μm. In some embodiments, the cap layer 30 is a multi-layer structure, and each layer includes at least one of Ni, Au, Pd, Ni-base alloy, Au-base alloy, or Pd-base alloy. In some embodiments, the cap layer 30 is a Ni film or a Ni alloy film formed by electrode plating process, electroless plating process or immersion plating process.

The solder layer 32 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In some embodiments, the solder layer 32 is a lead-free solder layer. For a lead-free solder system, the solder layer is SnAg with Ag content being controlled lower than 3.0 weight percent (wt %). In some embodiments, the lead-free solder layer is SnAg with Ag content being controlled at about 2.5 weight percent (wt %).

Figure 1F:
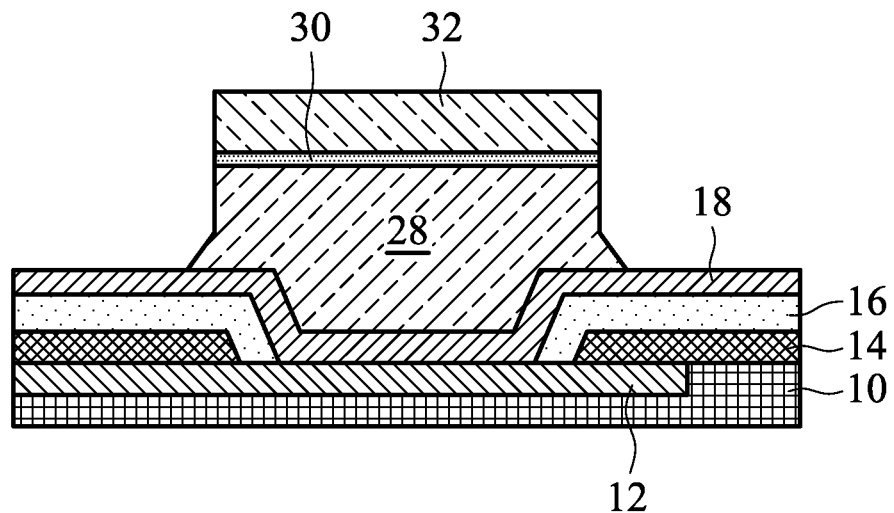
Figure 1G:
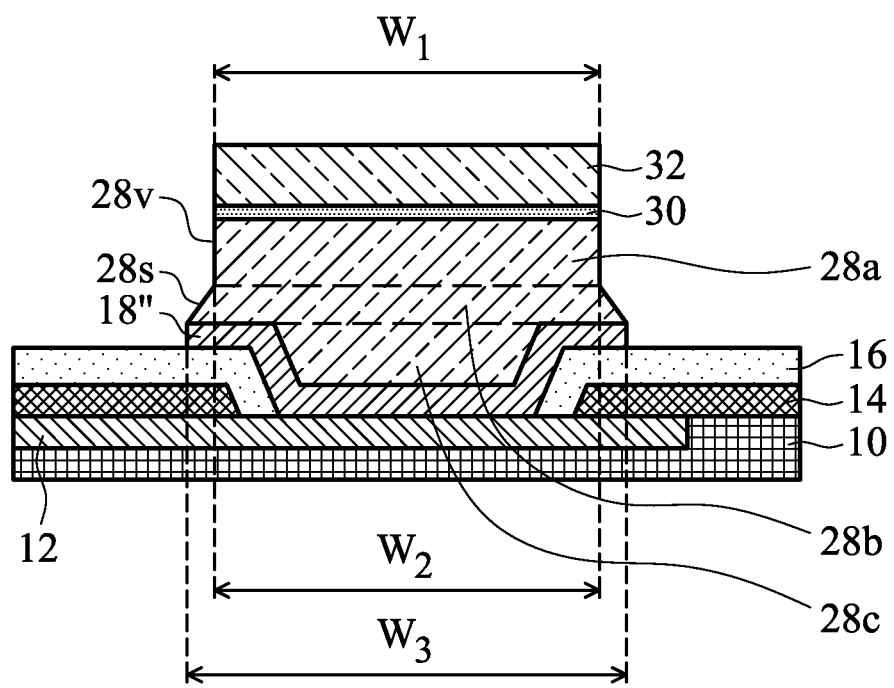

Thereafter, as shown in FIG. 1F, the photoresist structure 20 is removed to expose the UBM layer 18. The Cu layer 28 forms a Cu post 28. The process proceeds with the step of etching the UBM layer 18. With reference to FIG. 1G, using the Cu post 28 as the mask, an etching process is performed to remove the exposed portion of the UBM layer 18, exposing the underlying polymer layer 16.

The completed bump structure, as shown in FIG. 1G, includes the patterned UBM layer 18", the Cu post 28, the cap layer 30 and the solder layer 32. The Cu post 28 includes an upper portion 28a with a column-shaped cross-section, a middle portion 28b with a trapezoid-shaped cross-section, and a base portion 28c surrounding by the patterned UBM layer 18". The upper portion 28a has a first width $W_1$ and a vertical sidewall 28v. The middle portion 28b has a top width $W_2$, a bottom width $W_3$, and a sloped sidewall 28s. The width $W_3$ is greater than the width $W_2$, and the width $W_3$ is greater than the width $W_1$. The width $W_1$ may be substantially equal to the width $W_2$. In some embodiments, the difference between the width $W_3$ and the width $W_1$ is more than about 3 μm. The sloped sidewall 28s slopes from the wider portion upwardly towards the narrower portion and intersects the patterned UBM layer 18" at an angle less than 90 degrees, creating a footing profile at the bottom of the vertical sidewall 28v of the column-shaped cross-section. Also, the patterned UBM layer 18" is covered by the wider portion of the copper post 28, therefore the amount of UBM material that is retained is increased. Studies of the thermal stresses placed on various materials in a completed assembled integrated circuit using this exemplary embodiment shape for the copper pillars have shown that for most of the layers, such as ELK, UBM, underfill, pre-solder and the solder bumps, the thermal stress observed is lower than that of the conventional columnar-shaped Cu post.

A reflowing process may be performed to form a reflowed solder layer. The substrate 10 is then sawed and packaged onto a package substrate, or another die, with solder balls or Cu bumps mounted on a pad on the package substrate or the other die.

The disclosure provides a method of using a stack of negative-tone photoresist films with different photosensitivities on the UBM layer during the lithography process. The bird's beak opening can be created in the lower photoresist film, and thereby a Cu post with a footing profile can be obtained in subsequent processes. This method can define the dimension of the footing profile easily, and it requires no additional chemical or plasma process steps, and is therefore very low in cost to implement in an existing copper post forming process.

FIGS. 2A~2D are cross-sectional views of a portion of a device at various stages in an integrated circuit manufacturing process in accordance with an exemplary embodiment of forming a copper post. The explanation of the same or similar portions to the description in FIGS. 1A~1G will be omitted.

Figure 2A:
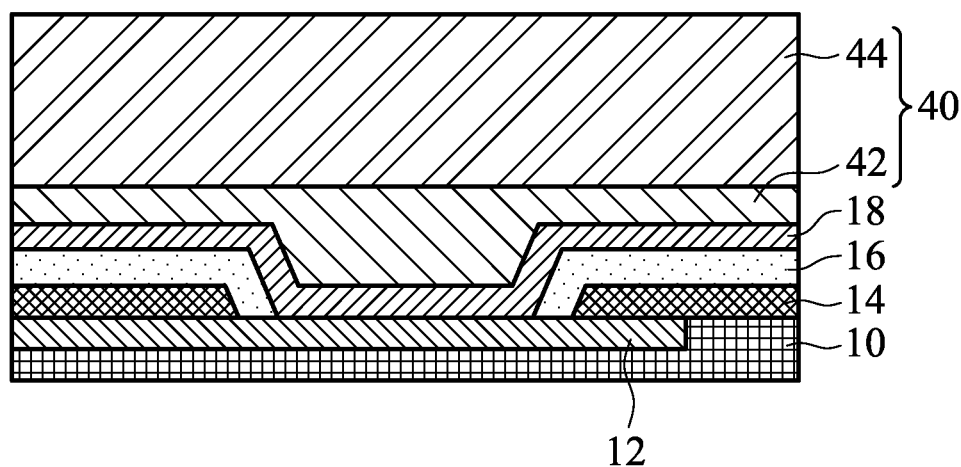
FIGS. 2A~2D are cross-sectional views of a portion of a device at various stages in an alternative integrated circuit manufacturing process that uses positive photo resist in accordance with an exemplary embodiment of forming a copper post.

With reference to FIG. 2A, there is shown the formation of a photoresist structure 40 on the UBM layer 18. The photoresist structure 40 is a stack including at least two photoresist films of different photosensitivities. In one embodiment, the photoresist structure 40 includes a first photoresist film 42, and a second photoresist film 44 on first photoresist film 42. The first photoresist film 42 is a positive photoresist, having a first photosensitivity and a first thickness. The second photoresist film 44 is a positive photoresist, having a second photosensitivity and a second thickness. The first photosensitivity is greater than the second photosensitivity, and the first thickness is less than the second thickness. For example, the first photoresist film 42 has a thickness of about from 3 μm to 15 μm, and the second photoresist film 44 has a thickness of about from 40 μm to 85 μm.

Figure 2B:
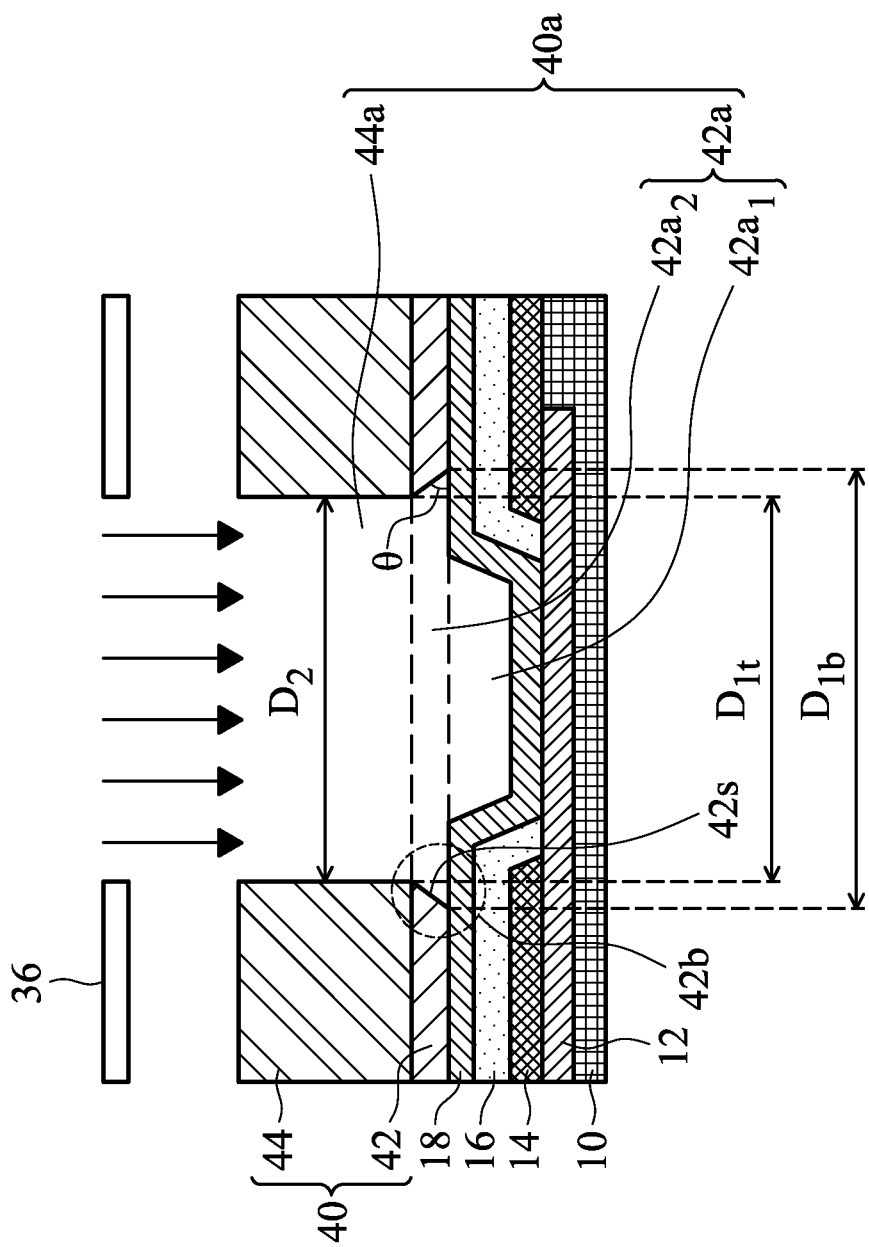

Next, as shown in FIG. 2B, a single-exposure process is employed to pattern features in the photoresist structure 40, which may be exposed to incident light, which may be deep-ultraviolet (DUV) radiation, mid-ultraviolet (MUV) radiation, or X-ray radiation. Alternatively, the photoresist structure 40 may be exposed to energetic electron in e-beam lithography. Using a mask layer 36, the energy of the photons or electrons causes changes in chemical composition of exposed portions of the photoresist structure 40, for example, by cross-linkage, scission, side chain removal, etc. Pre-baking or post-baking of the photoresist may be employed to maximize the changes in the chemical properties of the exposed portion of the photoresist relative to unexposed portions of the photoresist. Since the photoresist films 42 and 44 are formed of positive photoresist, the exposed portion of the photoresist structure 40 is developed and removed upon development.

This creates an opening 40a in the photoresist structure 40, which includes a first opening 42a formed by removing the exposed portion of the first photoresist film 42, and a second opening 44a formed by removing the exposed portion of the second photoresist film 44. The first opening 42a further includes a lower portion $42a_1$ surrounding by the UBM layer 18, and an upper portion $42a_2$ surrounding by the remaining portion of the first photoresist film 42. In detail, within the upper portion $42a_2$, the sidewall surface 42s of the first photoresist film 42 slopes and intersects the UBM layer 18 at an angle θ less than 90 degrees. Thus, a "bird's beak" opening 42b is formed at the interface between the first photoresist film 42 and the UBM layer 18. Also, the bottom diameter $D_{1b}$ of the upper portion $42a_2$ of the first opening 42a is wider than the diameter $D_2$ of the second opening 44a. When the openings are then filled with conductive materials in subsequent processes, a conductive post with a footing profile will be obtained.

Figure 2C:
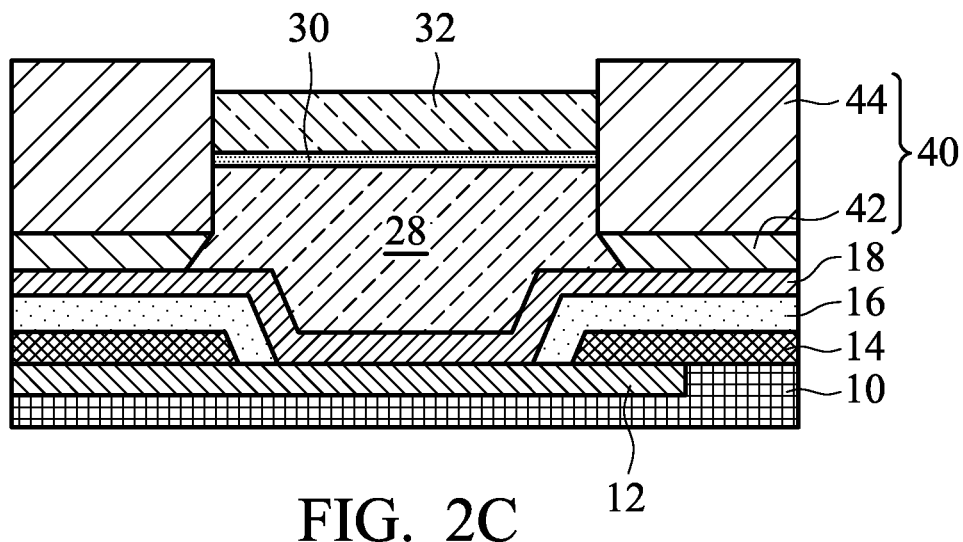

With reference to FIG. 2C, there is shown the formation of the copper layer 28 in the openings 42a and 44a, followed by the formation of the cap layer 30 and the solder layer 32. In some embodiments, the ECP process using a low initial deposition rate is performed to cause a "gap filling" effect, which enables the plated copper layer to fill the bird's beak opening 42b, resulting in a footing profile in the copper layer 28 in proximity to the UBM layer 18.

Figure 2D:
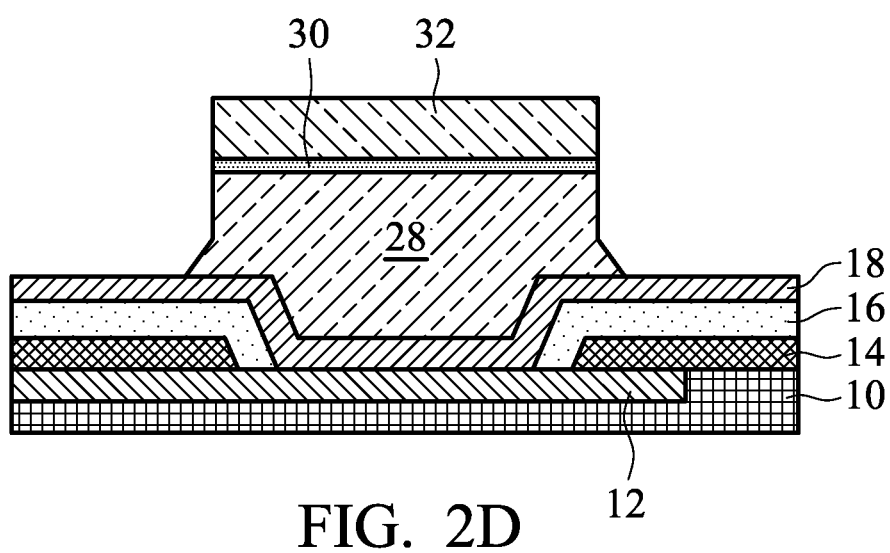

Next, as shown in FIG. 2D, the photoresist structure 40 is removed to expose the UBM layer 18. The Cu layer 28 protruding from the UBM layer 18 is referred to as a Cu post 28 hereinafter. The process proceeds with an etching process to remove the exposed portion of the UBM layer 18, exposing the underlying polymer layer 16. A reflowing process may be performed to form a reflowed solder layer. The substrate 10 is then sawed and packaged onto a package substrate, or another die, with solder balls or Cu bumps mounted on a pad on the package substrate or the other die.

This disclosure provides a method of using a stack of positive-tone photoresist films with different photosensitivities on the UBM layer during the lithography process. The bird's beak opening can be created in the lower photoresist film, and thereby a Cu post with a footing profile can be obtained in subsequent processes. This method can define the dimension of the footing profile easily, and it requires no additional chemical or plasma process steps, and is therefore very low in cost to implement in an existing copper post forming process.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. A method of forming an integrated circuit device, comprising:
    forming an under-bump-metallurgy (UBM) layer overlying a semiconductor substrate;
    forming a photoresist structure on the UBM layer, wherein the photoresist structure comprises a first photoresist film and a second photoresist film on the first photoresist film, and the first photoresist film and the second photoresist film have different photosensitivities;
    forming an opening in the photoresist structure to expose a portion of the UBM layer, wherein the opening comprises:
        a first opening in the first photoresist film, the first opening defined by sidewalls of the first photoresist film, and
        a second opening in the second photoresist film,
        wherein the first opening having a top diameter, and a bottom diameter greater than the top diameter;
    forming a conductive layer in the opening of the photoresist structure, electrically connected to the exposed portion of the UBM layer; and
    removing the photoresist structure, wherein the conductive layer forms a conductive post.

2. The method of claim 1, wherein the first photoresist film and the second photoresist film are formed of negative photoresist materials, and the photosensitivity of the second photoresist film is greater than the photosensitivity of the first photoresist film.

3. The method of claim 1, wherein the first photoresist film and the second photoresist film have different thicknesses.

4. The method of claim 3, wherein the first photoresist film is thinner than the second photoresist film.

5. The method of claim 1, wherein the second opening has a diameter less than the bottom diameter of the first opening.

6. The method of claim 1, further comprising forming a cap layer on the conductive layer in the opening before removing the photoresist structure.

7. The method of claim 6, wherein the cap layer comprises at least one of nickel or nickel alloys.

8. The method of claim 6, further comprising forming a solder layer on the cap layer in the opening before removing the photoresist structure.

9. The method of claim 1, wherein the conductive layer comprises at least one of copper or copper alloys.

10. A method of forming an integrated circuit device, comprising: forming an under-bump-metallurgy (UBM) layer overlying a semiconductor substrate;
    forming a first photoresist film on the UBM layer, the first photoresist film having a first photosensitivity and a first thickness,
    forming a second photoresist film on the first photoresist film, the second photoresist film having a second photosensitivity and a second thickness, wherein the second photosensitivity is greater than the first photosensitivity and the second thickness is greater than the first thickness;
    performing an exposure process on the second photoresist film and the first photoresist film;

removing an unexposed portion of the second photoresist film to form a first opening;

removing unexposed portions of the first photoresist film to expose a portion of the UBM layer and form a second opening underlying the first opening and a third opening underlying the second opening; wherein the second opening defined by sidewalls of the first photoresist film has a top diameter and a bottom diameter greater than the top diameter;

forming a copper layer in the first opening, the second opening and the third opening, electrically connected to the exposed portion of the UBM layer; and removing the second photoresist film and the first photoresist film, wherein the copper layer forms a copper post.

11. The method of claim 10, wherein the second opening has a sidewall intersecting the UBM layer at an angle less than 90 degrees.

12. The method of claim 10, wherein the difference between the bottom diameter and the top diameter is greater than 2 $\mu$m.

13. The method of claim 10, further comprising:
before the steps of removing the second photoresist film and the first photoresist film,
forming a cap layer on the copper layer in the first opening; and
forming solder layer on the cap layer in the first opening.

14. The method of claim 13, wherein the cap layer comprises at least one of nickel or nickel alloys.

15. A method of forming an integrated circuit device, comprising:
forming an under-bump-metallurgy (UBM) layer overlying a substrate;
forming a photoresist structure on the UBM layer, wherein the photoresist structure comprises a first photoresist film and a second photoresist film on the first photoresist film, and the first photoresist film is chemically less stable upon exposure than the second photoresist film; and forming an opening in the photoresist structure to expose a portion of the UBM layer, wherein the opening comprises a first opening in the first photoresist film and a second opening in the second photoresist film, the first opening having a top diameter and a bottom diameter greater than the top diameter, and the top diameter is substantially equal to a diameter of the second opening, wherein the first opening is defined by sidewalls of the first photoresist film.

16. The method of claim 15, wherein forming the opening comprises forming the opening where a difference between the top diameter and the bottom diameter is at least 3 micrometers ($\mu$m).

17. The method of claim 15, further comprising:
forming a passivation layer overlying the substrate, the passivation including a first opening exposing a conductive region on the substrate; and
forming a polymer layer overlying the passivation layer, the polymer layer having a second opening exposing the conductive region on the substrate, wherein a diameter of the second opening is less than a diameter of the first opening, and the UBM layer is formed overlying the polymer layer.

18. The method of claim 15, wherein forming the UBM layer comprises:
forming a diffusion barrier layer overlying the substrate, the diffusion barrier layer having a thickness ranging from about 500 Angstroms (Å) to about 2,000 Å; and
forming a seed layer overlying the diffusion barrier layer, the seed layer having a thickness ranging from about 500 Å to about 10,000 Å.

19. The method of claim 15, further comprising:
removing the photoresist structure; and
removing a portion of the UBM layer, wherein removing the portion of the UBM layer comprises removing the UBM layer positioned outside the bottom diameter.

* * * * *